United States Patent
Owada et al.

(10) Patent No.: US 7,642,185 B2
(45) Date of Patent: Jan. 5, 2010

(54) INSULATING FILM FORMING METHOD CAPABLE OF ENHANCING ADHESION OF SILICON CARBIDE FILM, ETC. AND SEMICONDUCTOR DEVICE

(75) Inventors: Tamotsu Owada, Kawasaki (JP); Hirofumi Watatani, Kawasaki (JP); Ken Sugimoto, Kawasaki (JP); Shun-ichi Fukuyama, Kawasaki (JP)

(73) Assignee: Fujitsu Microelectronics Limited, Tokyo (JP)

( * ) Notice: Subject to any disclaimer, the term of this patent is extended or adjusted under 35 U.S.C. 154(b) by 14 days.

(21) Appl. No.: 11/724,219

(22) Filed: Mar. 15, 2007

(65) Prior Publication Data

US 2007/0173054 A1 Jul. 26, 2007

Related U.S. Application Data

(62) Division of application No. 10/899,045, filed on Jul. 27, 2004, now Pat. No. 7,208,405.

(30) Foreign Application Priority Data

Apr. 28, 2004 (JP) .............................. 2004-133964

(51) Int. Cl.
*H01L 21/4763* (2006.01)
(52) U.S. Cl. ........................ 438/624; 438/736; 438/778; 257/760
(58) Field of Classification Search ................ 438/624, 438/736, 778; 257/760, E21.575, E21.597, 257/E21.627, E21.641
See application file for complete search history.

(56) References Cited

U.S. PATENT DOCUMENTS

| | | | |
|---|---|---|---|
| 6,417,092 B1 | 7/2002 | Jain et al. | |
| 6,627,532 B1 * | 9/2003 | Gaillard et al. | 438/623 |
| 6,875,687 B1 | 4/2005 | Weidman et al. | |
| 7,071,100 B2 | 7/2006 | Chen et al. | |
| 2003/0001273 A1 | 1/2003 | Steiner et al. | |
| 2005/0009320 A1 | 1/2005 | Goundar | |
| 2005/0014667 A1 | 1/2005 | Aoyama et al. | |
| 2005/0191851 A1 | 9/2005 | Liu et al. | |

FOREIGN PATENT DOCUMENTS

JP 2004-088047 A 3/2004

* cited by examiner

*Primary Examiner*—Theresa T Doan
(74) *Attorney, Agent, or Firm*—Westerman, Hattori, Daniels & Adrian, LLP

(57) ABSTRACT

A first film made of silicon carbide is formed over a substrate. The surface of the first film is exposed to an oxidizing atmosphere to oxidize the surface layer of the first film. The surface of the first film is made in contact with chemical which makes the surface hydrophilic. On the hydrophilic surface of the first film, a second film is formed which is an insulating film made of a low dielectric constant insulating material having a relative dielectric constant of 2.7 or smaller or an insulating film made by a coating method. A sufficient adhesion property is obtained when a film made of low dielectric constant insulating material is formed on an insulating film made of silicon carbide having a small amount of oxygen contents.

19 Claims, 11 Drawing Sheets

INSULATING FILM FORMING METHOD CAPABLE OF ENHANCING ADHESION OF SILICON CARBIDE FILM, ETC. AND SEMICONDUCTOR DEVICE

CROSS REFERENCE TO RELATED APPLICATION

This application is a division of application Ser. No. 10/899,045 filed Jul. 27, 2004, which is based on and claims priority of Japanese Patent Application No. 2004-133964 filed on Apr. 28, 2004, the entire contents of which are incorporated herein by reference.

BACKGROUND OF THE INVENTION

1) Field of the Invention

The present invention relates to an insulating film forming method and a semiconductor device, and more particularly to a method of forming a multi-layer insulating film structure including an insulating film made of silicon carbide and an insulating film made of insulating material having a dielectric constant lower than that of silicon oxide and to a semiconductor device having this multi-layer structure.

2) Description of the Related Art

In a multi-layer wiring structure of a semiconductor integrated circuit device, a transmission speed of an electric signal depends upon a wiring resistance and a parasitic capacitance between wiring lines. As the integration degree of recent semiconductor integrated circuit devices becomes higher, the distance between wiring lines becomes shorter and the parasitic capacitance becomes larger. In the generation in which the wiring distance is equal to or larger than 1 μm, a delay of a signal transmission speed caused by the parasitic capacitance had only a small influence on the process speed in a whole device. However, at a wiring distance of 0.5 μm or shorter, the influence of the parasitic capacitance between wiring lines became large, and especially at a wiring distance of 0.2 μm or shorter, it can be anticipated that the parasitic capacitance between wiring lines greatly influences the process speed in a device.

The parasitic capacitance between wiring lines can be reduced by thinning wiring lines. However, as the wiring line is thinned, the wiring resistance increases, hindering a high speed operation of a semiconductor integrated circuit device. A low dielectric constant of an insulating film is effective for reducing the parasitic capacitance without an increase in the wiring resistance.

Known low dielectric insulating materials include organic polyallylene and polyallyl ether, inorganic hydrogen silsesquioxane (HSQ), hybrid methyl silsesquioxane (MSQ), and mixture of HSQ and MSQ, respectively used for forming an insulating film by coating. Silicon oxycarbide has drawn attention as low dielectric constant insulating material, which is used for forming an insulating film by chemical vapor deposition (CVD) using organosiloxane-containing material as source gas.

A technique of lowering a dielectric constant is known by which voids are formed intentionally in a low dielectric constant insulating film independently from the film forming process used. This technique is associated with the development of low dielectric constant material and the progress of application to semiconductor integrated circuit devices, while maintaining a balance between a lowered dielectric constant and a lowered mechanical strength of a film caused by forming voids. Porous low dielectric constant material has recently been developed which has a lowered relative dielectric constant of 2.0 to 2.5 while realizing a Young's modulus of 5 to 7 GPa.

While interlayer insulating films for a wiring layer and a via layer of a damascene structure are made to have a lower dielectric constant, a barrier layer for preventing diffusion of conductive material copper (Cu) has also been desired to have a lower dielectric constant. Known good materials of the barrier layer for preventing copper diffusion include silicon nitride (SiN), oxygen-doped silicon carbide and the like, a film made of which is formed by CVD. The relative dielectric constants of silicon nitride and oxygen-doped silicon carbide are about 7.0 and 4.5, respectively, which cannot be said a low dielectric constant.

Attention has been paid recently to oxygen-undoped silicon carbide which is used for forming a film by CVD in a low oxygen density condition or a no-oxygen condition by using organosilane as source gas. An oxygen-undoped silicon carbide film contains only a small amount of oxygen or does not contain oxygen so that the relative dielectric constant can be lowered to about 3.5 or smaller while maintaining a good barrier performance of copper diffusion.

The surface of a copper diffusion barrier layer is generally hydrophobic. If a film made of low dielectric constant insulating material is formed on a hydrophobic surface, the adhesion of the film is likely to become poor. Japanese Patent Laid-open Publication No. 2004-88047 discloses the technique of forming a film made of low dielectric constant material after a hydrophilic process is performed for a film made of ESL3 manufactured by Novellus Systems Japan. In forming an ESL3 film, tetramethylsilane and carbon dioxide are used as source gasses. According to this method, the hydrophilic process is performed by making the surface of an ESL3 film contact with aqueous solution of ammonium fluoride. This hydrophilic process can enhance the adhesion between the silicon carbide film and the low dielectric insulating material film on the silicon carbide film.

A film made of ESL3 manufactured by Novellus Systems Japan contains oxygen. If a low dielectric constant insulating material film is to be formed on an insulating film made of oxygen-undoped silicon carbide, a sufficient adhesion property cannot be obtained by using only the hydrophilic process disclosed in Japanese Patent Laid-open Publication No. 2004-88047.

SUMMARY OF THE INVENTION

An object of this invention is to provide an insulating film forming method capable of providing a sufficient adhesion property even if a film of low dielectric constant insulating material is formed on an insulating film of silicon carbide having a small content of oxygen.

Another object of this invention is to provide a semiconductor device having a film of low dielectric constant insulating material formed on an insulating film of oxygen-undoped silicon carbide while providing a sufficient adhesion property.

According to a first aspect of the present invention, there is provided an insulating film forming method comprising steps of: forming a first film made of silicon carbide over a substrate; forming a second film on the first film, the second film being made of one insulating material selected from a group consisting of oxygen-doped silicon carbide, silicon oxycarbide and hydrogen silsesquioxane; and forming a third film on the second film, the third film being an insulating film made of a low dielectric constant insulating material having a relative dielectric constant of 2.7 or smaller or an insulating film made by a coating method.

According to a second aspect of the present invention, there is provided an insulating film forming method comprising steps of: forming a first film over a substrate, the first film being made of an insulating material selected from a group consisting of silicon carbide, oxygen-doped silicon carbide and silicon oxycarbide; forming a second film on the first film, the second film being an insulating film made of a low dielectric constant insulating material having a relative dielectric constant of 2.7 or smaller or an insulating film made by a coating method; and exposing the substrate formed with the second film to hydrogen plasma.

According to a third aspect of the present invention, there is provided an insulating film forming method comprising steps of: forming a first film over a substrate, the first film being an insulating film made of a low dielectric constant insulating material having a relative dielectric constant of 2.7 or smaller or an insulating film made by a coating method; forming a second film on the low dielectric constant insulating film, the second film being made of silicon oxide or silicon carbide; and exposing a surface of the second film to hydrogen plasma.

According to a fourth aspect of the present invention, there is provided a semiconductor device comprising: a first film made of an insulating material; a trench formed through the first film; a metal member filled in the trench; a second film made of oxygen-undoped silicon carbide and covering surfaces of the first film and the metal member; a third film disposed on the second film, the third film being made of one insulating material selected from a group consisting of oxygen-doped silicon carbide, silicon oxycarbide and hydrogen silsesquioxane; and a fourth film disposed on the third film, the fourth film being an insulating film made of a low dielectric constant insulating material having a relative dielectric constant of 2.7 or smaller or an insulating film made by a coating method.

In this specification, "oxygen-undoped silicon carbide" means silicon carbide which does not contain oxygen or has an oxygen density of about 10 atom % or smaller. "Oxygen-doped silicon carbide" and "silicon oxycarbide" both mean silicon carbide which contains oxygen, and a difference therebetween is an oxygen density in a skeleton.

FIGS. 11A and 11B show infrared spectral analysis results of oxygen-doped silicon carbide and silicon oxycarbide. The measurement result of oxygen-doped silicon carbide indicates that a ratio of an absorption peak height of Si—O to an absorption peak height of Si—C is about 1.5, whereas the measurement result of silicon oxycarbide indicates that the ratio is about 3. Oxygen-doped silicon carbide and silicon oxycarbide can be distinguished by infrared spectral analysis. For example, if the ratio of the absorption peak height of Si—O to the absorption peak height of Si—C is smaller than 2, it can be considered as oxygen-doped silicon carbide, whereas if the ratio is 2 or larger, it can be considered as silicon oxycarbide. An absorption peak is hardly observed for oxygen-undoped silicon carbide.

With the first aspect method, the second film made of oxygen-doped silicon carbide or the like is disposed between the first film of silicon carbide and the third film having a low dielectric constant, so that the adhesion degree can be increased.

With the second aspect method, the adhesion degree between the first film of silicon carbide or the like and the second film having a low dielectric constant can be increased by being subjected to hydrogen plasma exposure.

With the third aspect method, the adhesion degree between the first film having a low dielectric constant and the second film made of silicon carbide or the like can be increased by being subjected to hydrogen plasma exposure.

With the fourth aspect device, the adhesion degree can be increased by disposing the second film made of oxygen-doped silicon carbide between the first film made of oxygen-undoped silicon carbide and the third film having a low dielectric constant.

DESCRIPTION OF THE PREFERRED EMBODIMENTS

Figure 1:
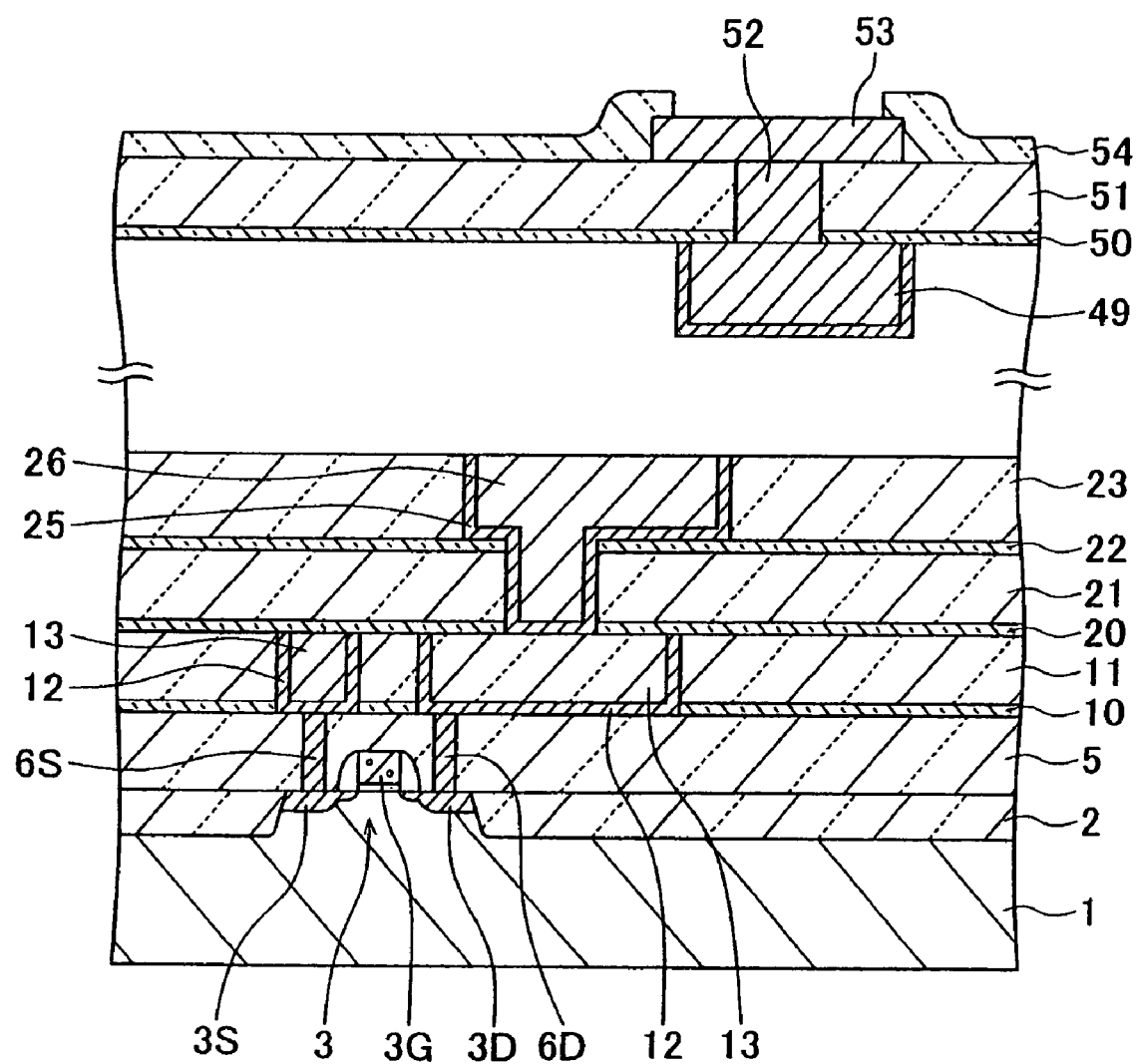
FIG. 1 is a cross sectional view of a semiconductor device manufactured by a method according to a first embodiment.

FIG. 1 is a cross sectional view showing an example of a semiconductor device manufactured by the method of the first embodiment. In the surface layer of a semiconductor substrate 1 made of silicon, an element isolation insulating film 2 is formed by shallow trench isolation (STI). In an active region surrounded by the element isolation insulating film 2, a MOSFET 3 is formed. MOSFET 3 comprises a source region 3S, a drain region 3D and a gate electrode 3G. MOSFET 3 can be formed by a well-known method.

An interlayer insulating film 5 of 1.5 μm in thickness made of phosphosilicate glass (PSG) is formed on the semiconductor substrate 1 by CVD, covering the MOSFET 3. Two via holes are formed through the interlayer insulating film 5. Conductive plugs 6S and 6D of tungsten (W) are filled in the via holes. The conductive plugs 6S and 6D are formed by forming a tungsten film covering the whole substrate surface and removing an unnecessary tungsten film by chemical mechanical polishing (CMP). The conductive plugs 6S and 6D are connected to the source region 3S and drain region 3D, respectively.

An etching stopper film 10 of 50 nm in thickness made of oxygen-undoped silicon carbide is formed on the interlayer insulating film 5. An interlayer insulating film 11 of low dielectric constant material is formed on the etching stopper film 10. The interlayer insulating film 11 is made of, for example, hybrid porous silica mixed with MSQ and HSQ. Such an insulating material may be NCS (trade name) available from Catalysts & Chemicals Ind. Co. Ltd.

A plurality of wiring trenches are formed through the interlayer insulating film 11 and etching stopper film 10. The inner surface of the wiring trench is covered with a barrier metal layer 12 of 30 nm in thickness made of TaN, and a wiring 13 of copper is filled in the wiring trench. A wiring 13 is connected to the lower level conductive plug 6S, and another wiring 13 is connected to the lower level conductive plug 6D. The wiring 13 and barrier metal layer 12 are formed by a well-known single damascene method. The detailed description will be made later on a method of forming a film of oxygen-undoped silicon carbide and a film of low dielectric constant insulating material.

On the interlayer insulating film 11, an etching stopper film 20 of 50 nm in thickness made of oxygen-undoped silicon carbide, an interlayer insulating film 21 of 250 nm in thickness made of hybrid porous silica, a middle stopper film 22 of 30 nm in thickness made of oxygen-undoped silicon carbide and an interlayer insulating film 23 of 170 nm in thickness made of hybrid porous silica are formed in this order from the bottom.

A wiring trench is formed through the interlayer insulating film 23, and a via hole is formed through the middle stopper film 22, interlayer insulating film 21 and etching stopper film 20. The inner surfaces of the wiring trench and via hole are covered with a barrier metal layer 25 of 30 nm in thickness made of TaN. A wiring 26 of copper is filled in the via hole and interlayer insulating film 23. The barrier metal layer 25 and wiring 26 are formed by a well-known dual damascene method. The insulating films from the etching stopper film 20 to the interlayer insulating film 23, the barrier metal layer 25 and wiring 26 constitute one wiring layer. The etching stopper film 20 has a function of preventing diffusion of copper constituting the underlying wiring 13, in addition to a function of stopping etching during the via hole formation.

While the etching stopper film 20 in an area corresponding to the bottom of the via hole is removed, a portion or the whole of the middle stopper film 22 in an area corresponding to the bottom of the wiring trench is removed in some cases.

Formed on the interlayer insulating film 23 are a plurality of wiring layers each having the structure similar to that of the wiring layer including the wiring 26.

Formed on the uppermost wiring layer are an etching stopper film 50 made of oxygen-doped silicon carbide and an interlayer insulating film 51 made of hybrid porous silica. A via hole is formed through the interlayer insulating film 51 and etching stopper film 50. A conductive plug 52 of tungsten is filled in the via hole. The conductive plug 52 is connected to a lower level wiring 49.

A pad 53 of aluminum is formed on the interlayer insulating film 51. The pad 53 is connected to the lower level conductive plug 52. The pad 53 and interlayer insulating film 51 are covered with a protective film 54 made of silicon nitride. An opening exposing the surface of the pad 53 is formed through the protective film 54.

With reference to FIGS. 2A to 2D, description will be made on a method of forming the etching stopper film 20 and the interlayer insulating film 21 on the interlayer insulating film 11 shown in FIG. 1. The method described hereinunder is applicable to the other processes of forming the film of hybrid porous silica on the film of oxygen-undoped silicon carbide shown in FIG. 1.

Figure 2A:
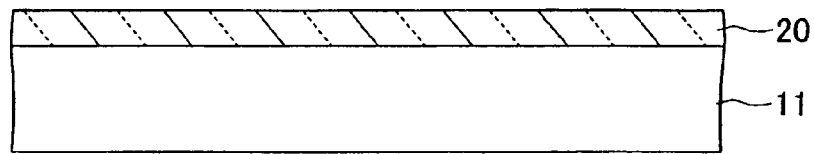
FIGS. 2A to 2D are cross sectional views of a substrate illustrating an insulating film forming method of the first embodiment.

As shown in FIG. 2A, a base substrate with an exposed interlayer insulating film 11 is prepared. This base substrate includes the lamination structure from the semiconductor substrate 1 to the interlayer insulating film 11 and wiring 13 shown in FIG. 1. On the interlayer insulating film 11, the etching stopper film 20 is formed by CVD using tetramethylsilane as source gas. By using the source gas not containing oxygen elements, a film of oxygen-undoped silicon carbide can be formed. The film forming conditions are as follows. The diameter of the substrate used is 200 mm, and the area of each of parallel plate electrodes for supplying an RF power is approximately equal to that of the substrate.

Figure 2B:
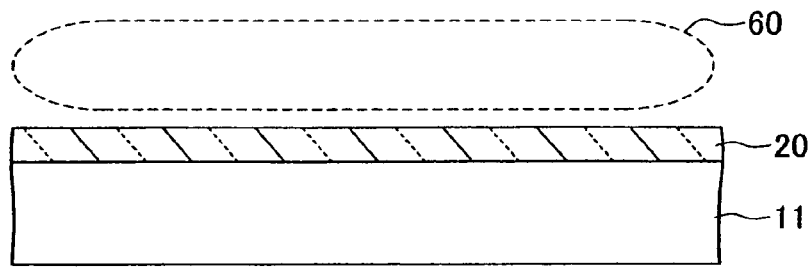

Flow rate of tetramethylsilane: 650 sccm
Pressure: about 600 Pa (4.5 Torr)
RF power at 13.56 MHz: 500 W
RF power at 400 kHz: 150 W As shown in FIG. 2B, the surface of the etching stopper film 20 is exposed to plasma 60 of carbon dioxide. The plasma process conditions are as follows.

Figure 2C:
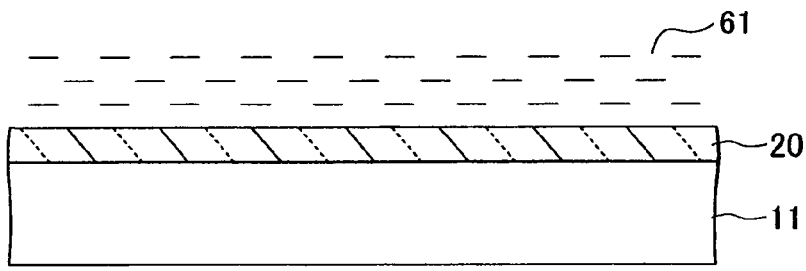

Carbon dioxide flow rate: 5000 sccm
Pressure: about 470 Pa (3.5 Torr)
RF power at 13.56 MHz: 100 W
Process time: 5 sec As shown in FIG. 2C, the surface of the etching stopper film 20 is made in contact with hydrophilic chemical 61 in a wet wafer washing chamber. The chemical 61 is, for example, aqueous solution of dimethylacetamide and ammonium fluoride. A contact angle measured before the hydrophilic process by dispensing pure water on the surface of the etching stopper film 20 was about 100°. A similar measurement conducted after the hydrophilic process showed a contact angle of 40°. It can therefore be understood that the surface of the etching stopper film 20 changes from hydrophobic to hydrophilic.

Figure 2D:
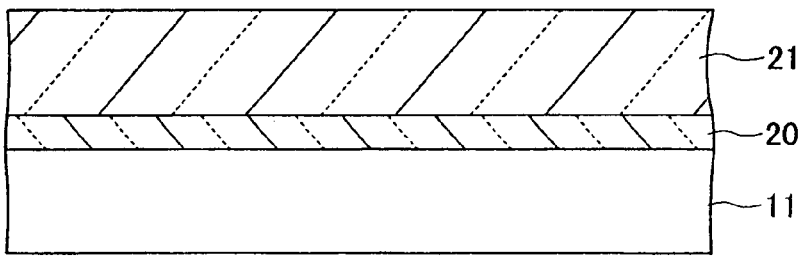

As shown in FIG. 2D, the interlayer insulating film 21 is formed on the etching stopper film 20 by coating, the interlayer insulating film being made of hybrid porous silica mixed with MSQ and HSQ (the trade name, NCS, manufactured by Catalysts & Chemicals Ind. Co. Ltd.). After the coating, curing was performed at 400° C. for 60 minutes.

The adhesion degree of the lamination structure formed by the above-described method was evaluated by a stub-pull test.

Figure 3:
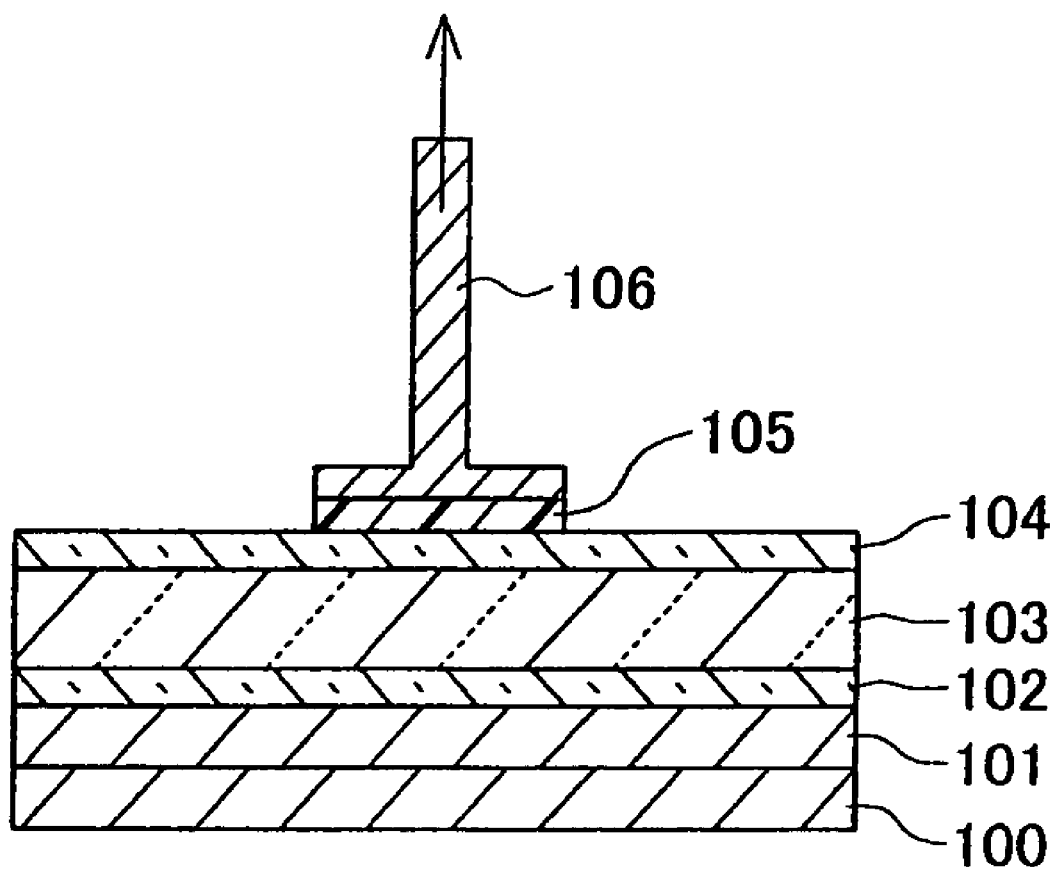
FIG. 3 is a cross sectional view of a sample subjected to a stud-pull test.

FIG. 3 is a schematic cross sectional view of a sample used by a stud-pull test. A copper film 101 is formed on a silicon substrate 100. On the copper film 101, an oxygen-undoped silicon carbide film 102 and a hybrid porous silica film 103 are formed. On the film 103, a cap film 104 of SiC is formed. A stud 106 is adhered to the cap film 104 with epoxy adhesive 105. The oxygen-undoped silicon carbide film 102 and hybrid porous silica film 103 are formed by the above-described first embodiment method.

A stud-pull test resulted in a break between the stud 106 and cap film 104. A tensile force at the break was about 70 MPa (about 700 $kgf/cm^2$). Namely, the adhesion strength at the interface between the oxygen-undoped silicon carbide film 102 and porous silica film 103 is considered as 70 MPa, a measurement limit of the stud-pull test, or larger.

In contrast to this, for a sample without the process of exposing the film to the carbon dioxide plasma shown in FIG. 2B, a break occurred at the interface between the oxygen-undoped silicon carbide film 102 and porous silica film 103 at a tensile force of about 20 MPa (200 $kgf/cm^2$).

As seen from this evaluation test, the adhesion degree of the interlayer insulating film 21 of porous silica can be increased by performing the carbon dioxide plasma process shown in FIG. 2B. The reason of the improved adhesion degree may be ascribed to that a thin surface layer of the etching stopper film 20 of oxygen-undoped silicon carbide is oxidized by the carbon dioxide plasma process. The surface of the etching stopper film 20 may be exposed to an oxidizing atmosphere other than carbon dioxide plasma to oxidize its surface layer. For example, the etching stopper film may be exposed to plasma of carbon monoxide, nitrogen monoxide, nitrogen dioxide, dinitrogen monoxide, dinitrogen trioxide, dinitrogen tetraoxide, dinitrogen pentaoxide or the like.

In the above-described embodiment, hybrid porous silica mixed with MSQ and HSQ is used as the low dielectric insulating material. Even if other low dielectric insulating materials are used, similar effects can be expected. The film forming method of this embodiment is particularly effective when insulating material having a relative dielectric constant of 2.7 or smaller is used as the material of the interlayer insulating film. This method is also effective when the interlayer insulating film 21 is formed by coating.

In the above-described embodiment, as chemical for the hydrophlic process shown in FIG. 2C, although aqueous solution of dimethylacetamide and ammonium fluoride is used, other aqueous solutions such as aqueous solution which contains ammonium salt may also be used.

Next, with reference to FIGS. 4A to 4C, the second embodiment will be described. A semiconductor device manufactured by the second embodiment is almost the same as that shown in FIG. 1. The second embodiment is characterized by a film forming method for the films from the etching stopper film 20 to interlayer insulating film 23 of the semiconductor device shown in FIG. 1.

Figure 4A:
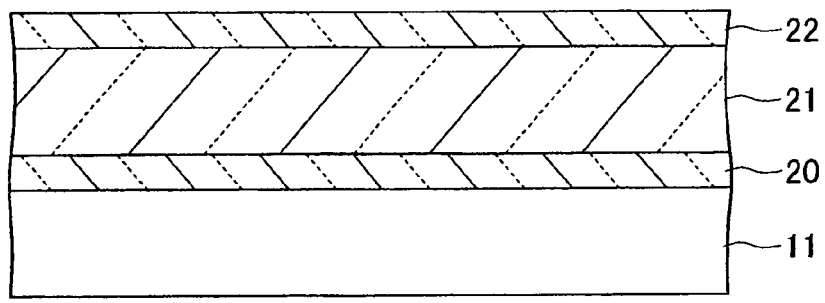
FIGS. 4A to 4C are cross sectional views of a substrate illustrating an insulating film forming method according to a second embodiment.

As shown in FIG. 4A, a base substrate with an exposed interlayer insulating film 11 is prepared. Formed on the interlayer insulating film 11 are an etching stopper film 20 of 50 nm in thickness made of oxygen-undoped silicon carbide, an interlayer insulating film 21 of 250 nm in thickness made of hybrid porous silica and a middle stopper film 22 of 30 nm in thickness made of oxygen-doped silicon carbide. A method of forming the etching stopper film 20 and interlayer insulating film 21 is the same as the method of forming the etching stopper film 20 and interlayer insulating film 21 of the first embodiment described with reference to FIGS. 2A and 2D. In the second embodiment, after the etching stopper film 20 is formed, the oxidizing and hydrophlic process for the surface layer of the etching stopper film is not executed.

The middle stopper film 22 is made of ESL2 manufactured by Novellus Systems Japan. Source gasses used are tetramethylsilane and carbon dioxide. With this procedure, the middle stopper film 22 of oxygen-doped silicon carbide is formed.

Figure 4B:
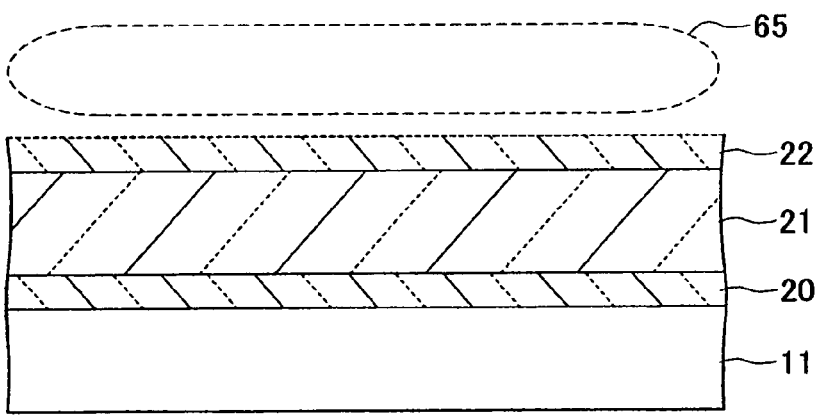

As shown in FIG. 4B, the surface of the middle stopper film 22 is exposed to hydrogen plasma 65. The conditions of this hydrogen plasma process are as follows.

Figure 4C:
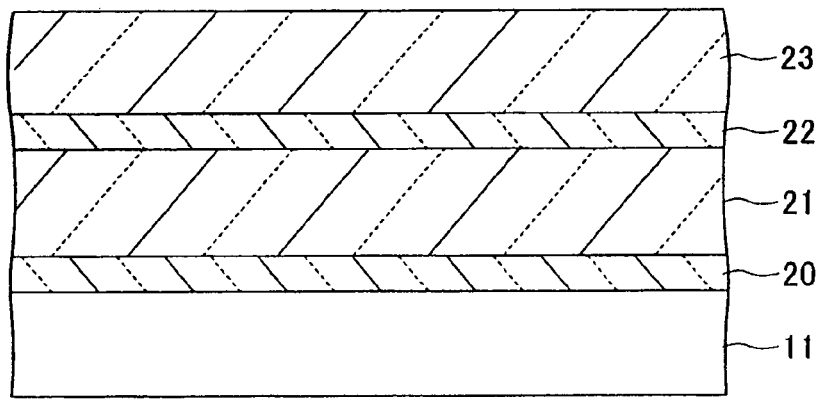

Hydrogen flow rate: 4000 sccm
Pressure: 307 Pa (2.3 Torr)
RF power at 13.56 MHz: 250 W As shown in FIG. 4C, on the middle stopper film 22 subjected to the hydrogen plasma process, an interlayer insulating film 23 of 170 nm in thickness made of hybrid porous silica is formed. A method of forming the interlayer insulating film 23 is the same as the method of forming the underlying interlayer insulating film 21.

In this embodiment, although the hydrogen plasma process is executed after the middle stopper film 22 is formed, a process of depositing a portion of the middle stopper film 22 and a hydrogen plasma process may be executed alternately to eventually form the middle stopper film 22 having a desired thickness.

Figure 5:
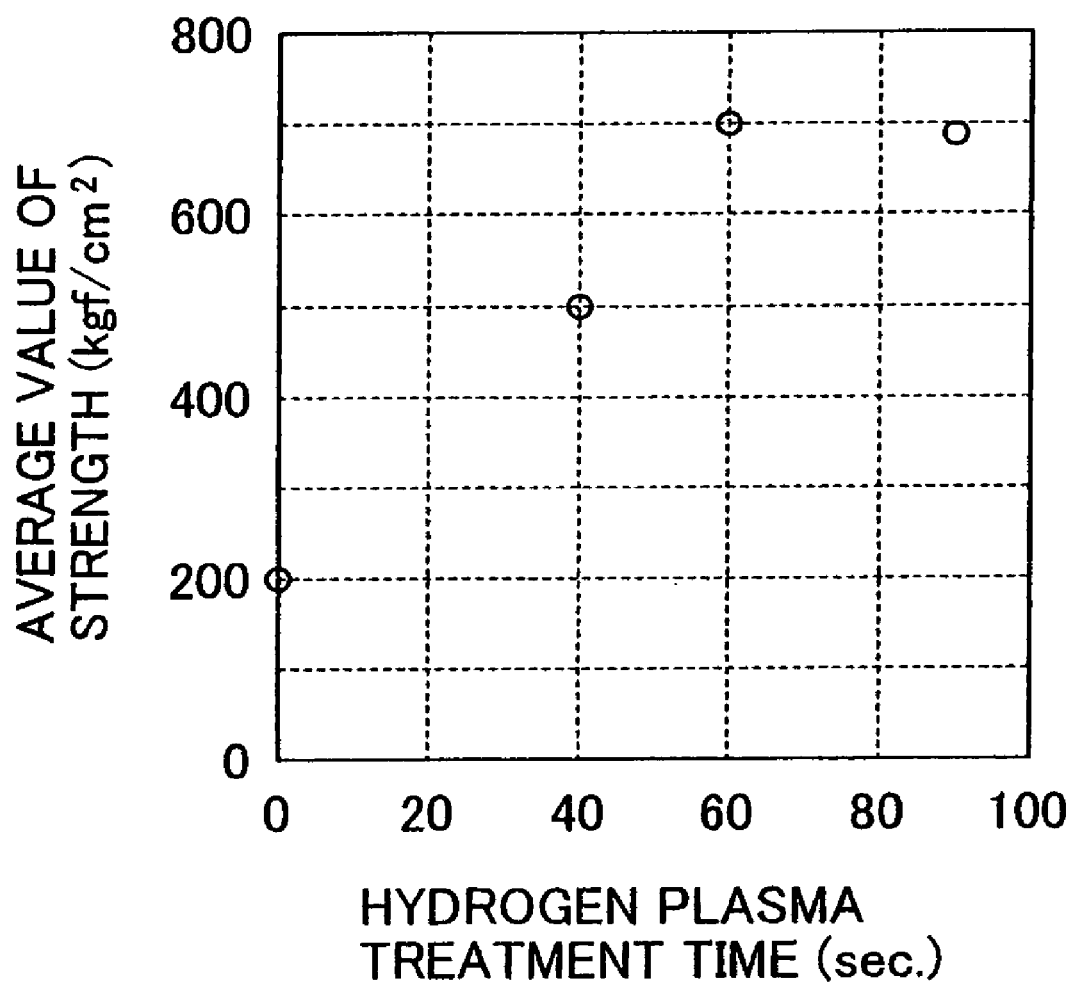
FIG. 5 is a graph showing the relation between a hydrogen plasma process time and an average of adhesion strengths of samples formed by the method of the second embodiment.

With reference to FIG. 5, the effects of the hydrogen plasma process will be described. FIG. 5 shows the results of stud-pull tests conducted in the state immediately after the middle stopper film 22 is formed. The abscissa represents a hydrogen plasma process time in the unit of "second" and the ordinate represents a tensile force at which a break occurs in the unit of "$kgf/cm^2$". A sample at a hydrogen plasma process time of 0 sec was not subjected to the hydrogen plasma process. The remaining three samples were formed by executing the process of depositing a portion of the middle stopper film 22 and a hydrogen plasma process alternately three times. The hydrogen plasma process time on the ordinate of the graph indicates the total time of three hydrogen processes.

It can be seen from the graph shown in FIG. 5 that the adhesion degree at the interface between the etching stopper film 20 and the interlayer insulating film 21 is improved by exposing the surface of the middle stopper film 22 to hydrogen plasma. A break occurred at the interface between the etching stopper film 20 and the interlayer insulating film 21 at the tensile force of 500 $kgf/cm^2$ when the plasma etching process was executed for 40 seconds. As the hydrogen plasma process time is prolonged to 60 seconds or longer, a break did not occur at the interface between the etching stopper film 20 and the interlayer insulating film 21, even at a tensile force of 700 $kgf/cm^2$ which is a measurement limit of the stud-pull test.

It can be considered from the above-described evaluation results that it is preferable to set the hydrogen plasma process time to 50 seconds or longer.

In the second embodiment, although the middle stopper film 22 is made of oxygen-doped silicon carbide, it may be made of oxygen-undoped silicon carbide or silicon oxycarbide. The interlayer insulating film 21 may be exposed directly to hydrogen plasma before the middle stopper film 22 is formed.

Also, in the first embodiment, the hydrogen plasma process may be executed after the interlayer insulating film 21 shown in FIG. 2D is formed. In this case, the adhesion degree of the interlayer insulating film 21 can be increased further.

Figure 6:
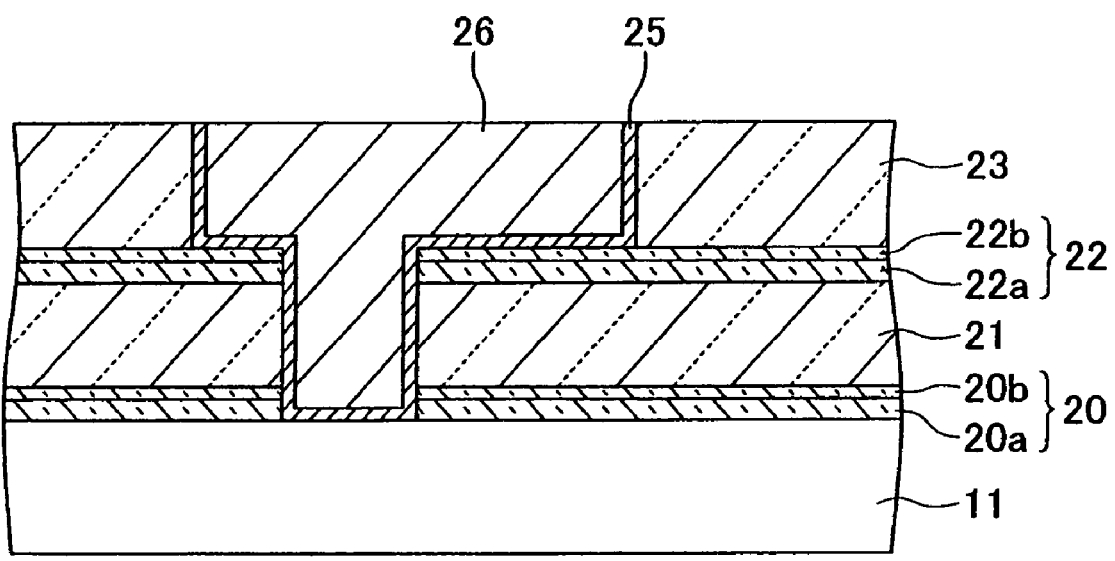
FIG. 6 is a cross sectional view of one layer of a semiconductor device formed by a method according to a third embodiment.

FIG. 6 is a cross sectional view showing one wiring layer of a semiconductor device manufactured by a third embodiment method. The wiring layer shown in FIG. 6 corresponds to the wiring layer including the wiring 26 in FIG. 1 referenced by the first embodiment. In the following, different points from the wiring layer shown in FIG. 1 will be described.

In the first embodiment, the etching stopper film 20 is a single film made of oxygen-undoped silicon carbide. In the third embodiment, the etching stopper film 20 has a two-layer structure. A lower etching stopper film 20a is made of oxygen-undoped silicon carbide and has a thickness of 35 nm. An upper etching stopper film 20b is made of oxygen-doped silicon carbide and has a thickness of 15 nm. A total thickness of the two layers is 50 nm so that a sufficient etching stopper function and a sufficient copper diffusion preventing function can be provided.

The middle stopper film 22 has also a two-layer structure. A lower middle stopper film 22a is made of oxygen-undoped silicon carbide and has a thickness of 15 nm. An upper middle stopper film 22b is made of oxygen-doped silicon carbide and has a thickness of 15 nm. A total thickness of the two layers is 30 nm so that a sufficient etching stopper function can be provided.

With reference to FIGS. 7A to 7E, description will be made on a method of manufacturing a semiconductor device according to the third embodiment.

Figure 7A:
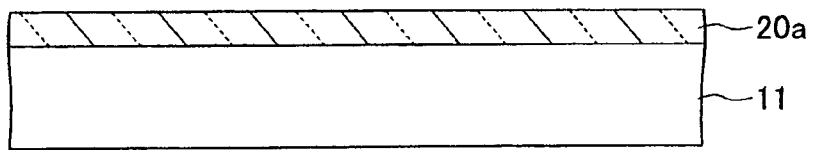
FIGS. 7A to 7E are cross sectional views of a substrate illustrating an insulating film forming method of the third embodiment.

As shown in FIG. 7A, a base substrate with an exposed interlayer insulating film 11 is prepared. This base substrate includes the lamination structure from the semiconductor substrate 1 to the interlayer insulating film 11 and wiring 13 shown in FIG. 1. On the insulating film 11, the lower etching stopper film 20a made of oxygen-undoped silicon carbide is formed. The film forming method is the same as the method of forming the etching stopper film 20 of the first embodiment described with reference to FIGS. 2A.

Figure 7B:
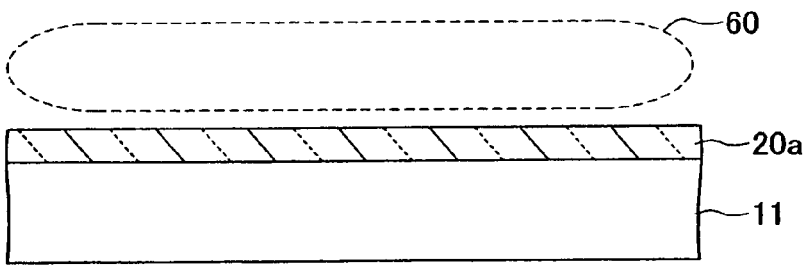

As shown in FIG. 7B, the surface of the lower etching stopper film 20a is exposed to carbon dioxide plasma 60 to oxidize the surface layer thereof. The plasma process conditions are the same as the plasma process conditions of the first embodiment described with reference to FIGS. 2B.

Figure 7C:
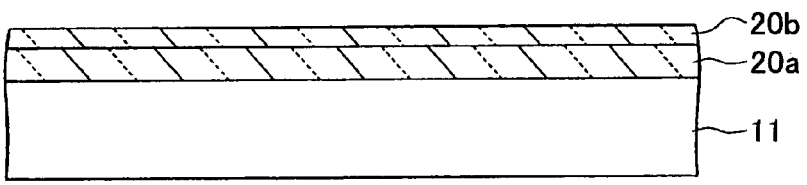

As shown in FIG. 7C, on the lower etching stopper film 20a, the etching stopper film 20b of 15 nm in thickness made of oxygen-doped silicon carbide is formed. For example, the upper etching stopper film 20b is made of ESL3 manufactured by Novellus Systems Japan. The source gasses used are tetramethylsilane and carbon dioxide.

Figure 7D:
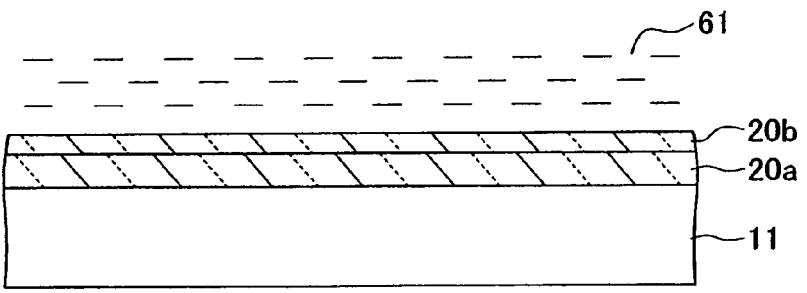

As shown in FIG. 7D, the upper etching stopper film 20b is made in contact with hydrophilic chemical 61 to make the surface thereof hydrophilic. This hydrophilic process is the same as the hydrophilic process of the first embodiment described with reference to FIG. 2C.

Figure 7E:
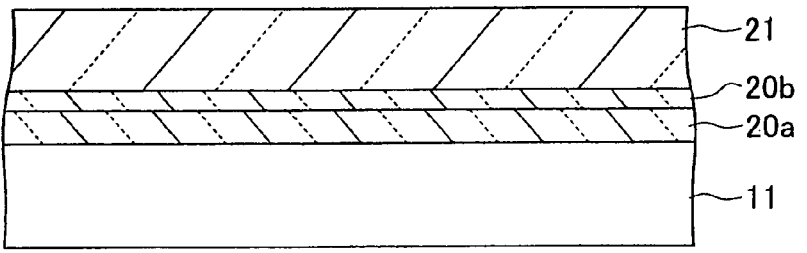

As shown in FIG. 7E, on the upper etching stopper film 20b, an interlayer insulating film 21 of hybrid porous silica is formed. The method of forming the interlayer insulating film 21 is the same as the method of forming the interlayer insulating film 21 of the first embodiment described with reference to FIG. 2D.

The method of forming the middle stopper film 22 and the interlayer insulating film 23 on the middle stopper film is similar to the method of forming the etching stopper film 20 and interlayer insulating film 21.

In the third embodiment, the upper etching stopper film 20b provides a function of increasing the adhesion degree of the interlayer insulating film 21 on the upper etching stopper film 20b. Similarly, the upper middle stopper film 22b provides a function of increasing the adhesion degree of the interlayer insulating film 23 on the upper middle stopper film 22b. As compared to the structure of the first embodiment, a higher adhesion degree can be obtained. However, since the dielectric constant of oxygen-doped silicon is higher than that of oxygen-undoped silicon carbide, the first embodiment is more effective from the viewpoint of parasitic capacitance.

Figure 8:
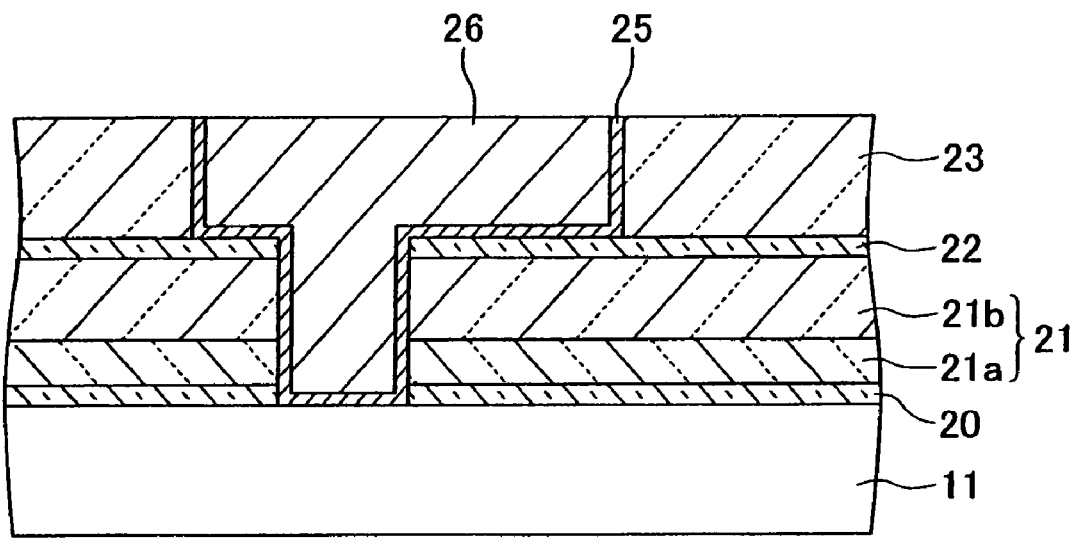
FIG. 8 is a cross sectional view of one layer of a semiconductor device formed by a method according to a fourth embodiment.

FIG. 8 is a cross sectional view showing one wiring layer of a semiconductor device manufactured by a fourth embodiment method. The wiring layer shown in FIG. 8 corresponds to the wiring layer including the wiring 26 in FIG. 1 referenced by the first embodiment. In the following, different points from the wiring layer shown in FIG. 1 will be described.

In the first embodiment, the interlayer insulating film 21 is a single layer made of hybrid porous silica. In the fourth embodiment, the interlayer insulating film 21 has a two-layer structure. A lower interlayer insulating film 21a is made of silicon oxycarbide and has a thickness of 100 nm. An upper interlayer insulating film 21b is made of hybrid porous silica and has a thickness of 150 nm.

With reference to FIGS. 9A to 9D, description will be made on a method of manufacturing a semiconductor device according to the fourth embodiment.

Figure 9A:
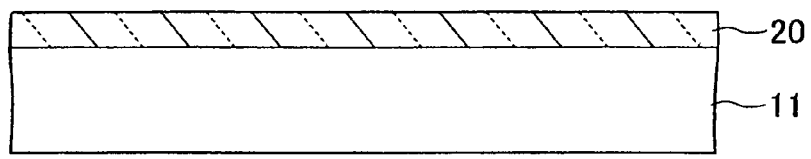
FIGS. 9A to 9D are cross sectional views of a substrate illustrating an insulating film forming method of the fourth embodiment.

As shown in FIG. 9A, a base substrate with an exposed interlayer insulating film 11 is prepared. This base substrate includes the lamination structure from the semiconductor substrate 1 to the interlayer insulating film 11 and wiring 13 shown in FIG. 1. On the insulating film 11, an etching stopper film 20 made of oxygen-undoped silicon carbide is formed. The film forming method is the same as the method of forming the etching stopper film 20 of the first embodiment described with reference to FIGS. 2A.

Figure 9B:
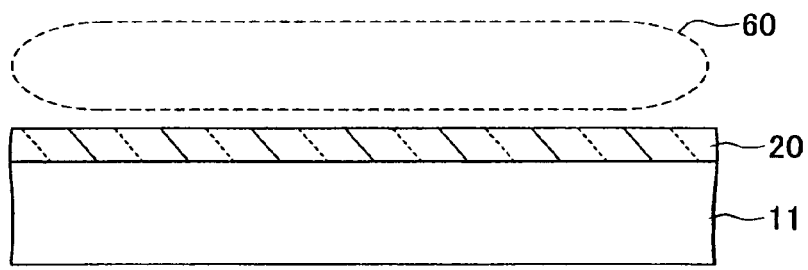

As shown in FIG. 9B, the surface of the etching stopper film 20 is exposed to carbon dioxide plasma 60 to oxidize the surface layer thereof. The plasma process conditions are the same as the plasma process conditions of the first embodiment described with reference to FIGS. 2B.

Figure 9C:
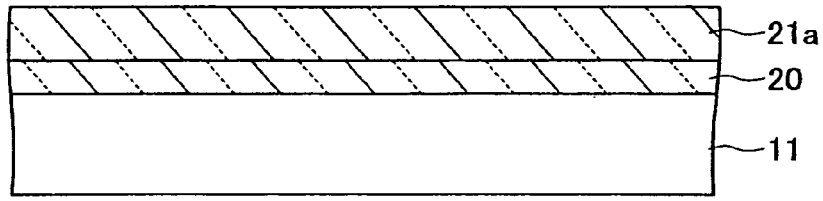

As shown in FIG. 9C, the lower interlayer insulating film 21a of silicon oxycarbide is formed by CVD using tetramethylcyclotetrasiloxane (TMCTS) and carbon dioxide as source gasses. The film forming conditions are as follows.

Figure 9D:
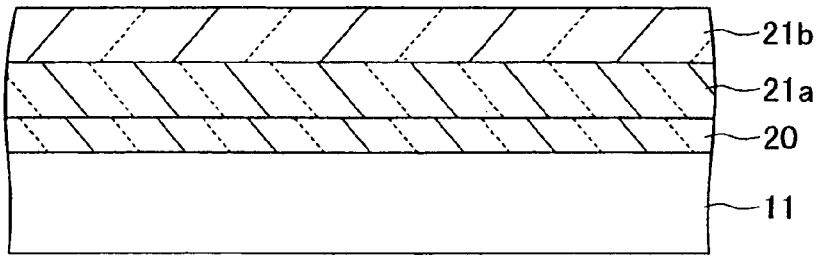

TMCTS flow rate: 1 sccm
Carbon dioxide flow rate: 5000 sccm
Pressure: 470 Pa (3.5 Torr)
RF power at 13.56 MHz: 300 W
RF power at 400 kHz: 200 W As shown in FIG. 9D, on the lower interlayer insulating film 21a, the upper interlayer insulating film 21b of hybrid porous silica is formed. The method of forming the upper interlayer insulating film 21b is the same as the method of forming the interlayer insulating film 21 of the first embodiment described with reference to FIG. 2D.

A relative dielectric constant of the upper interlayer insulating film formed under the above-described film forming conditions was 2.9 and a Young's modulus was 20 GPa. An adhesion force between the upper interlayer insulating film 21b and lower interlayer insulating film 21a was a measurement limit (70 GPa) of the stud-pull test or larger.

In the fourth embodiment, the upper interlayer insulating film 21b of hybrid porous silica does not come in direct contact with the etching stopper film 20 of oxygen-undoped silicon carbide. Since the lower interlayer insulating film 21a of silicon oxycarbide is interposed therebetween, a high adhesion degree can be obtained.

In the fourth embodiment, although silicon oxycarbide is used as the material of the lower interlayer insulating film 21a, a silsesquioxane film formed by coating may be used.

Figure 10A:
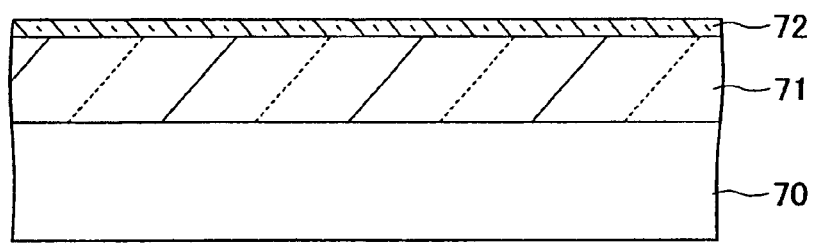
FIGS. 10A and 10B are cross sectional views of a substrate illustrating an insulating film forming method according to a fifth embodiment.

Next, with reference to FIG. 10, the fifth embodiment will be described. The above-described first to fourth embodiments aim at improving the adhesion degree when a film made of low dielectric constant insulating material such as hybrid porous silica is formed on the film made of oxygen-undoped silicon carbide by a coating method. In the fifth embodiment, the stack order of films is reversed. Namely, the film made of oxygen-undoped silicon carbide is formed on the film made of low dielectric constant insulating material such as hybrid porous silica. Attention is drawn to the adhesion property of this case.

A higher adhesion property is generally obtained when a film of oxygen-undoped silicon carbide is formed on a film of low dielectric constant insulating material by CVD, than when a film of low dielectric constant insulating material is formed on a film of oxygen-undoped silicon carbide by a coating method. The former is also desired to retain still a higher adhesion property in order to further improve the reliability of a semiconductor device.

As shown in FIG. 1A, on a base substrate 70, an insulating film 71 of hybrid porous silica is formed. The base substrate 70 has the lamination structure, for example, from the semiconductor substrate 1 to the interlayer insulating film 11 and wiring 13 shown in FIG. 1. On the insulating film 71, an insulating film 72 of oxygen-undoped silicon carbide is formed by CVD.

Figure 10B:
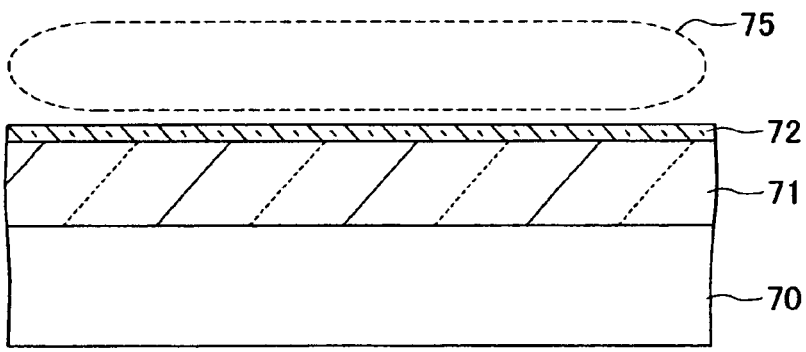
Figure 11B:
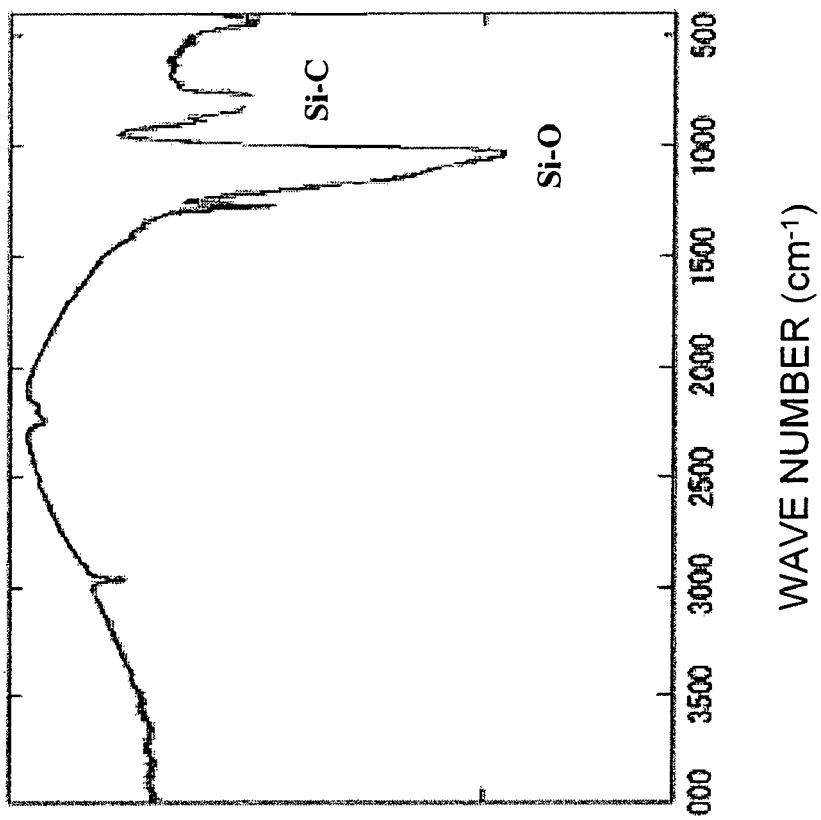
FIGS. 11A and 11B are graphs showing infrared spectrum analysis results of oxygen-doped silicon carbide and silicon oxycarbide, respectively.
Figure 11A:
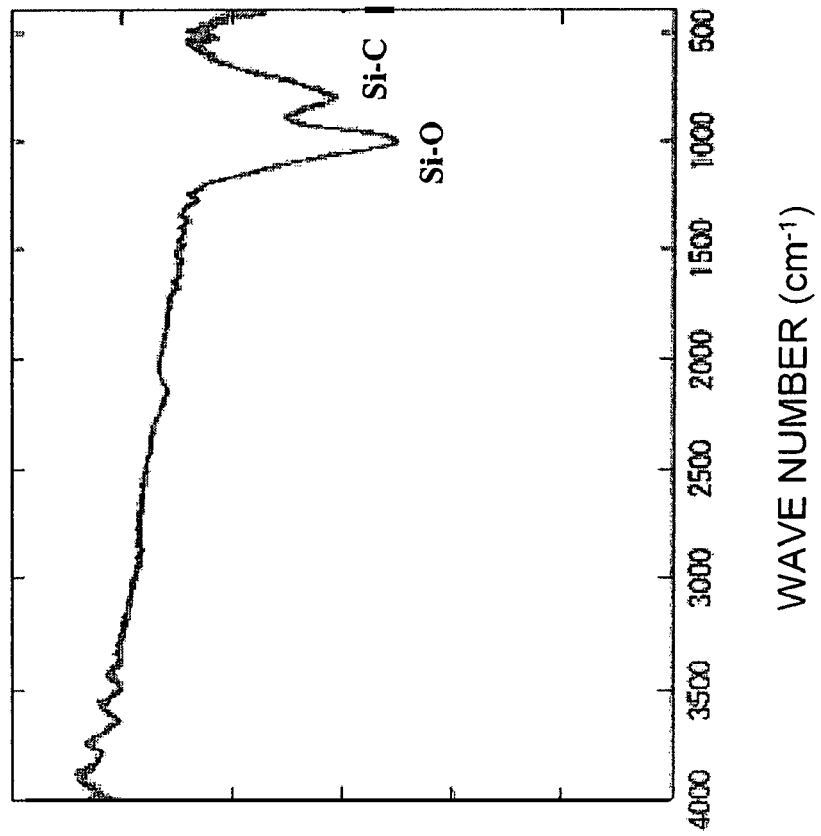

As shown in FIG. 10B, the surface of the insulating film 72 is exposed to hydrogen plasma 75. The hydrogen plasma process conditions are the same as the hydrogen plasma process conditions of the second embodiment described with reference to FIG. 4B.

With this plasma process, the adhesion degree can be increased at the interface between the insulating film 71 of hybrid porous silica or the like and the insulating film 72 of oxygen-undoped silicon carbide. Also in the case that the insulating film 72 is made of silicon oxide, it is expected that the adhesion degree can be increased by the hydrogen plasma process.

The hydrogen plasma process may be executed a plurality of times while the insulting film 72 is formed. For example, the process of depositing a portion of the insulating film 72 and a hydrogen plasma process may be executed alternately to form the insulating film 72 having a desired thickness.

The present invention has been described in connection with the preferred embodiments. The invention is not limited only to the above embodiments. It will be apparent to those skilled in the art that other various modifications, improvements, combinations, and the like can be made.

We claim:

1. An insulating film forming method, comprising steps of:
    forming a first film comprising silicon carbide over a substrate;
    forming a second film on the first film, the second film comprising one insulating material selected from the group consisting of oxygen-doped silicon carbide, silicon oxycarbide and hydrogen silsesquioxane, wherein the step of forming the second film includes a step of forming the second film by exposing a surface of the first film to an oxidizing atmosphere to oxidize a surface layer of the first film, and making the second film in contact with chemical which makes a surface of the second film hydrophilic;
    exposing the substrate formed with the second film to hydrogen plasma; and
    forming a third film on the second film, the third film being an insulating film comprising a low dielectric constant insulating material having a relative dielectric constant of 2.7 or smaller or an insulating film disposed through a coating method.

2. An insulating film forming method comprising steps of:
    forming a first film over a substrate, the first film comprising an insulating material selected from a group consisting of silicon carbide, oxygen-doped silicon carbide and silicon oxycarbide;
    forming a second film on the first film, the second film being an insulating film disposed through a coating method; and
    exposing the substrate formed with the second film to hydrogen plasma; and
    forming a fourth film to be in contact with a surface exposed to the hydrogen plasma, the fourth film being made of insulating material.

3. The insulating film forming method according to claim 2, wherein in the step of forming the first film, the first film is deposited by chemical vapor deposition using a source gas which does not contain an oxygen atom.

4. The insulating film forming method according to claim 2, further comprising a step of, after the second film is formed and before the substrate with the second film is exposed to the hydrogen plasma, forming a third film on the second film, the third film comprising an insulating material selected from a group consisting of silicon carbide, oxygen-doped silicon carbide and a silicon oxycarbide, wherein the hydrogen plasma exposing step exposes the second film to the hydrogen plasma via the third film.

5. The insulating film forming method according to claim 4, further comprising a step of, after the hydrogen plasma exposing process and before forming the fourth film executing alternately a process of forming a film having a same composition as a composition of the third film and a hydrogen plasma exposing process at least one cycle.

6. The insulating film forming method according to claim 2, wherein a total time of the hydrogen plasma exposing process is 50 seconds or longer.

7. An insulating film forming method comprising steps of:
    forming a first film over a substrate, the first film being an insulating film disposed through a coating method;
    forming a second film on the insulating film, the second film comprising silicon oxide or silicon carbide; and
    exposing a surface of the second film to hydrogen plasma; and
    forming a fourth film to be in contact with a surface exposed to the hydrogen plasma, the fourth film being made of insulating material.

8. The insulating film forming method according to claim 7, wherein in the step of forming the second film, the second film is deposited by chemical vapor deposition using a source gas which does not contain an oxygen atom.

9. The insulating film forming method according to claim 7, wherein in the second film forming step and the hydrogen plasma exposing step, a process of depositing a portion of the second film and a hydrogen plasma exposing process are alternately executed at least two cycles.

10. The insulating film forming method according to claim 7, wherein the exposing is performed with the second film covering whole surface of the substrate.

11. An insulating film forming method comprising steps of:
    forming a first film over a substrate, the first film comprising an insulating material selected from a group consisting of silicon carbide, oxygen-doped silicon carbide and silicon oxycarbide;
    forming a second film on the first film, the second film being an insulating film comprising a low dielectric constant insulating material having a relative dielectric constant of 2.7 or smaller or an insulating film disposed through a coating method;
    exposing the substrate formed with the second film to hydrogen plasma;
    after exposing the substrate formed with the second film to hydrogen plasma, forming an interlayer insulating film over the second film;
    forming a wiring trench through the interlayer insulating film and a via hole through the second film; and
    forming a wiring which fills the wiring trench and the via hole.

12. The insulating film forming method according to claim 11, wherein in the step of forming the first film, the first film is deposited by chemical vapor deposition using a source gas which does not contain an oxygen atom.

13. The insulating film forming method according to claim 11, further comprising a step of, after the second film is formed and before the substrate with the second film is exposed to the hydrogen plasma, forming a third film on the second film, the third film comprising an insulating material selected from a group consisting of silicon carbide, oxygen-doped silicon carbide and a silicon oxycarbide, wherein the hydrogen plasma exposing step exposes the second film to the hydrogen plasma via the third film.

14. The insulating film forming method according to claim 13, further comprising a step of, after the hydrogen plasma exposing process, executing alternately a process of forming a film having a same composition as a composition of the third film and a hydrogen plasma exposing process at least one cycle.

15. The insulating film forming method according to claim 11, wherein a total time of the hydrogen plasma exposing process is 50 seconds or longer.

16. An insulating film forming method comprising steps of:
- forming a first film over a substrate, the first film being an insulating film comprising a low dielectric constant insulating material having a relative dielectric constant of 2.7 or smaller or an insulating film disposed through a coating method;
- forming a second film on the low dielectric constant insulating film, the second film comprising silicon oxide or silicon carbide; and
- exposing a surface of the second film to hydrogen plasma;
- after exposing the substrate formed with the second film to hydrogen plasma, forming an interlayer insulating film over the second film;
- forming a wiring trench through the interlayer insulating film and a via hole through the second film; and
- forming a wiring which fills the wiring trench and the via hole.

17. The insulating film forming method according to claim 16, wherein in the step of forming the second film, the second film is deposited by chemical vapor deposition using a source gas which does not contain an oxygen atom.

18. The insulating film forming method according to claim 16, wherein in the second film forming step and the hydrogen plasma exposing step, a process of depositing a portion of the second film and a hydrogen plasma exposing process are alternately executed at least two cycles.

19. The insulating film forming method according to claim 2, wherein the exposing is performed with the second film covering whole surface of the substrate.

* * * * *